(12) United States Patent
Gebreselasie et al.

(10) Patent No.: US 8,530,319 B2
(45) Date of Patent: Sep. 10, 2013

(54) VERTICAL SILICIDE E-FUSE

(75) Inventors: Ephrem G. Gebreselasie, South Burlington, VT (US); Joseph M. Lukaitis, Pleasant Valley, NY (US); Robert R. Robison, Colchester, VT (US); William R. Tonti, Essex Junction, VT (US); Ping-Chuan Wang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 111 days.

(21) Appl. No.: 12/904,435

(22) Filed: Oct. 14, 2010

(65) Prior Publication Data

US 2012/0091556 A1    Apr. 19, 2012

(51) Int. Cl.
*H01L 21/20* (2006.01)
*H01L 21/44* (2006.01)

(52) U.S. Cl.
USPC .............. 438/379; 438/600; 438/601

(58) Field of Classification Search
USPC ............. 438/381–399, 597–617, 658–659, 438/682–683; 257/528–543
See application file for complete search history.

(56) References Cited

U.S. PATENT DOCUMENTS

| | | | |
|---|---|---|---|
| 5,365,105 A | 11/1994 | Liu et al. | |
| 5,621,232 A * | 4/1997 | Ohno | 257/288 |
| 5,625,220 A | 4/1997 | Liu et al. | |
| 6,093,609 A * | 7/2000 | Chuang | 438/286 |
| 6,100,569 A * | 8/2000 | Yeh | 257/413 |
| 6,368,902 B1 | 4/2002 | Kothandaraman et al. | |
| 6,512,299 B1 * | 1/2003 | Noda | 257/774 |
| 6,566,759 B1 | 5/2003 | Conrad et al. | |
| 6,812,542 B2 | 11/2004 | Kohyama | |
| 6,933,591 B1 | 8/2005 | Sidhu et al. | |
| 6,979,601 B2 | 12/2005 | Marr et al. | |
| 7,089,136 B2 | 8/2006 | Anand et al. | |
| 7,129,769 B2 | 10/2006 | Dixon et al. | |
| 7,200,064 B1 | 4/2007 | Boerstler et al. | |
| 7,227,207 B2 | 6/2007 | Park et al. | |
| 7,348,637 B2 * | 3/2008 | Ashida et al. | 257/371 |
| 7,382,036 B2 | 6/2008 | Nowak et al. | |
| 7,485,944 B2 | 2/2009 | Kothandaraman et al. | |
| 7,489,180 B2 | 2/2009 | Marshall | |
| 7,562,272 B2 | 7/2009 | Beattie et al. | |
| 7,572,724 B2 | 8/2009 | Nowak et al. | |
| 7,635,620 B2 | 12/2009 | Chen et al. | |
| 7,659,168 B2 | 2/2010 | Hsu et al. | |
| 7,674,691 B2 | 3/2010 | Cestero et al. | |
| 7,688,930 B2 | 3/2010 | Beattie et al. | |
| 7,697,361 B2 | 4/2010 | Lee et al. | |
| 7,745,855 B2 | 6/2010 | Henson et al. | |
| 2005/0013187 A1 | 1/2005 | Anand et al. | |
| 2005/0272256 A1 * | 12/2005 | Wang | 438/637 |
| 2006/0087001 A1 | 4/2006 | Kothandaraman et al. | |
| 2006/0157819 A1 | 7/2006 | Wu | |
| 2006/0181330 A1 | 8/2006 | Dixon et al. | |

(Continued)

*Primary Examiner* — Fernando L Toledo
*Assistant Examiner* — Karen Kusumakar
(74) *Attorney, Agent, or Firm* — Gibb & Riley, LLC; Anthony J. Canale

(57) ABSTRACT

An apparatus and a method of manufacturing an e-fuse includes a substrate, a patterned gate insulator on the substrate, and a patterned gate conductor on the patterned gate insulator. The patterned gate conductor has sidewalls and a top. A silicide contacts the sidewalls of the patterned gate conductor, the top of the patterned gate conductor, and a region of the substrate adjacent the patterned gate insulator and the patterned gate conductor.

12 Claims, 18 Drawing Sheets

(56) References Cited

U.S. PATENT DOCUMENTS

| | | |
|---|---|---|
| 2007/0026579 A1 | 2/2007 | Nowak et al. |
| 2007/0210411 A1* | 9/2007 | Hovis et al. .................. 257/529 |
| 2007/0210890 A1 | 9/2007 | Hsu et al. |
| 2008/0142606 A1 | 6/2008 | Wu |
| 2008/0153278 A1 | 6/2008 | Nowak et al. |
| 2008/0237834 A1 | 10/2008 | Hu et al. |
| 2008/0243313 A1 | 10/2008 | Schaeffer |
| 2008/0290456 A1 | 11/2008 | Miyashita et al. |
| 2009/0001506 A1 | 1/2009 | Kim et al. |
| 2009/0057819 A1* | 3/2009 | Shin et al. .................. 257/529 |
| 2009/0179302 A1 | 7/2009 | Kothandaraman et al. |
| 2009/0310266 A1 | 12/2009 | Etherton et al. |
| 2010/0019344 A1 | 1/2010 | Chuang et al. |
| 2010/0038747 A1 | 2/2010 | Chanda et al. |
| 2010/0072571 A1 | 3/2010 | Min |
| 2010/0078727 A1 | 4/2010 | Min et al. |
| 2010/0133649 A1* | 6/2010 | Lin et al. .................. 257/529 |

* cited by examiner

US 8,530,319 B2

VERTICAL SILICIDE E-FUSE

BACKGROUND

The present embodiments herein relate to producing a space efficient vertical e-fuse without requiring change in the materials that are used for semiconductor fabrication of e-fuses or FETs. The e-fuse design of the present embodiments herein can be fabricated as a discrete device or very densely in array environments, thereby producing more cells, or fuses, per a given area.

SUMMARY

According to one embodiment, an e-fuse includes a substrate, a patterned insulator on the substrate and a patterned conductor on the patterned insulator. The patterned conductor has sidewalls and a top. A silicide contacts the sidewalls of the patterned conductor, the top of the patterned conductor, and a region of the substrate adjacent the patterned insulator and the patterned conductor.

According to another embodiment, an e-fuse includes a substrate, a patterned gate insulator on the substrate, and a patterned gate conductor on the patterned gate insulator. The patterned gate conductor has sidewalls and a top. A silicide contacts the sidewalls of the patterned gate conductor, the top of the patterned gate conductor, and a region of the substrate adjacent the patterned gate insulator and the patterned gate conductor.

According to an additional embodiment, one method of manufacturing an e-fuse provides a structure having a substrate, a patterned insulator, a patterned conductor having a top and sidewalls, an insulating oxide spacer covering the patterned insulator and at least one of the sidewalls of the patterned conductor, an insulating nitride cap covering the top of the patterned conductor, and an insulating nitride spacer covering the insulating oxide spacer. The embodiment then removes the insulating nitride cap, the insulating nitride spacer and the insulating oxide spacer from one side of the patterned insulator and the patterned conductor. The method applies a silicide to the top and a sidewall of the patterned conductor, the patterned insulator and a region of the substrate adjacent the patterned insulator. A first electrical contact is provided on the silicide over the top of the patterned conductor, and a second electrical contact is provided on the silicide over the region of the substrate adjacent the pattered insulator.

According to another embodiment, one method of manufacturing an e-fuse provides a structure having a substrate, a patterned gate insulator, a patterned gate conductor having a top and sidewalls, an insulating oxide spacer covering the patterned gate insulator and at least one of the sidewalls of the patterned gate conductor, an insulating nitride cap covering the top of the patterned gate conductor, and an insulating nitride spacer covering the insulating oxide spacer. The embodiment then removes the insulating nitride cap, the insulating nitride spacer and the insulating oxide spacer from one side of the patterned gate insulator and the patterned gate conductor. The method applies a silicide to the top and a sidewall of the patterned gate conductor, the patterned gate insulator and a region of the substrate adjacent the patterned gate insulator. A first electrical contact is provided on the silicide over the top of the patterned gate conductor, and a second electrical contact is provided on the silicide over the region of the substrate adjacent the pattered gate insulator.

DETAILED DESCRIPTION

In computing, an electronic fuse or "e-fuse" is a device that is used to program or reprogram computer chips dynamically in real-time. E-fuses allow a chip manufacturer to change the application of circuits on a chip while it is in operation. While conventional fuses are blown or programmed by destroying the conductor, and making the fuse permanently non-conductive (or permanently conductive for anti-fuses) as is understood by those ordinarily skilled in the art, e-fuses are generally blown or programmed by changing the resistance level of the conductor within the e-fuse. One application of this technology is to provide in-chip performance tuning. If certain sub-systems fail, or are taking too long to respond, or are consuming too much power, a chip can instantly change its behavior by 'blowing' one or more e-fuses to engage different components on the chip. In the embodiments described below, a standard field effect transistor (FET) is modified to become an e-fuse, and the silicide that covers the e-fuse is altered to program this form of e-fuse. When the silicide of the present FET based e-fuse is altered, the resistance of the e-fuse changes, thereby blowing or programming the e-fuse described herein.

More specifically, the embodiments presented herein produce a fuse, (an e-fuse), at the thick oxide FET gate terminal level or on the shallow trench isolation (STI) region. The localization of the e-fuse at this area minimizes space, shortens wiring length and allows greater density of e-fuses for array applications. DG (Double Gate) or TG (Triple Gate) FETs may be utilized for the embodiments herein. Ntype or Ptype FETs produced in Bulk or silicon-on-insulator (SOI) substrates may be used. High dielectric constant (high-K) metal gate devices or standard devices may also be used for the e-fuse.

The embodiments herein work by processing the FET gate silicide vertically to an adjacent CA (Cathode/Anode). Silicide then replaces a portion of the nitride spacer that has been removed. As with a standard e-fuse, the silicide serves as the fuse link. In an alternative embodiment, the existing silicide on the FET Gate is connected to the silicide at the drain or source terminal. The FET gate then acts as the anode and the diffusion region acts as the cathode, thereby creating optimal joule heating for efficient and effective fuse programming. The silicide material may be very thin (e.g., 2 nm to 20 nm) and electro-migration of silicide material occurs at one of the silicide corners of the gate insulator and the substrate during programming.

Figure 1:
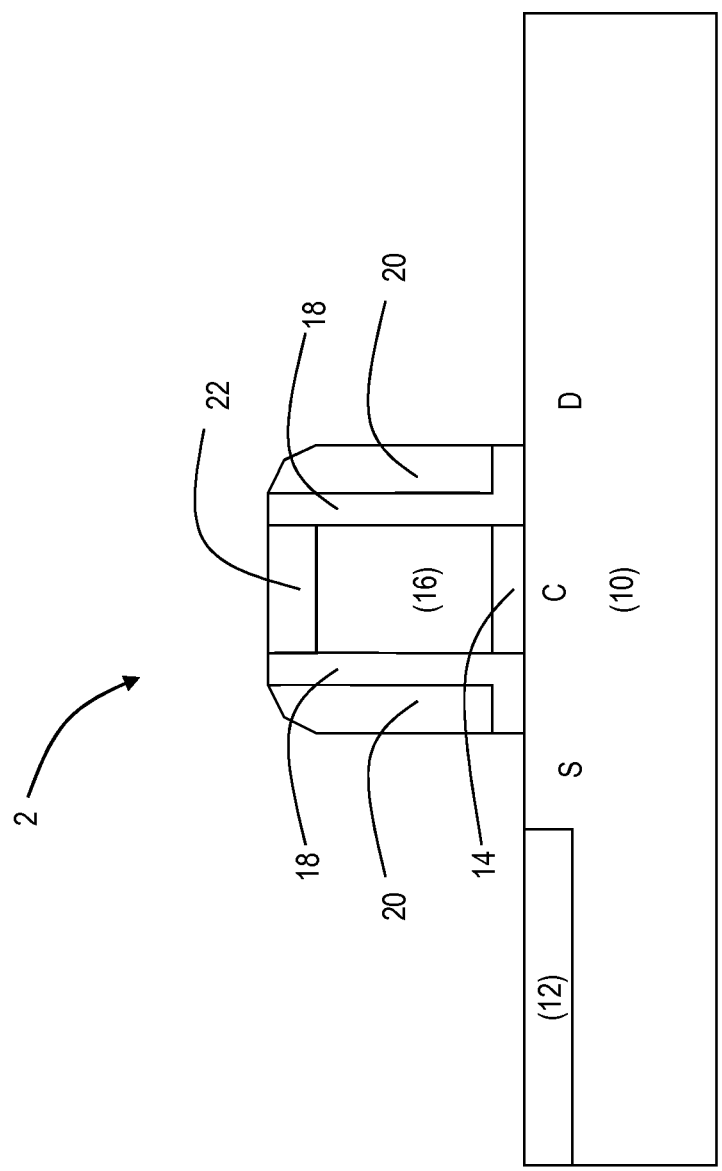
FIG. 1 illustrates an embodiment including a preliminary structure on a silicon substrate.

With reference to FIG. 1, an nFET device 2 that includes a silicon substrate 10 having an isolation region STI 12 disposed in the substrate 10. A gate insulator 14 which may include an oxide layer is disposed below a gate 16 which may include polysilicon (pSi). Oxide spacers 18 are disposed between the gate 16 and sidewall nitride spacers 20 and between the nitride spacers 20 and the silicon substrate 10. A nitride cap 22 is formed over the gate 16 and between the upper portions of oxide spacers 18 and nitride spacers 20. A similar nFET device is shown in U.S. Pat. No. 7,635,620 at FIG. 1, wherein this reference is fully incorporated by reference.

The semiconductor substrate 10 can be, for example, a bulk silicon (Si) substrate or a silicon-on-insulator (SOI) substrate. Alternatively, the substrate 10 can be a hybrid substrate which includes more than one surface orientation. The substrate alternatively includes a semiconductor material other than Si, such as Ge or any combination of Group III-V elements or Group II-V elements.

After an initial substrate cleaning procedure (conventional), an isolation scheme is carried out. As is well known in semiconductor manufacturing, the isolation scheme is used to separate selected semiconductor devices electrically from each other. The isolation scheme is a standard or a modified shallow trench isolation (STI) scheme. An isolation region STI 12 is shown in FIG. 1. Alternatively, the isolation is accomplished using a local oxidation of silicon (LOCOS) process or mesa isolation scheme, as is well known in the art of fabricating semiconductor devices. For various known or conventional processes for fabricating semiconductor devices, see for example VLSI Technology, 2nd Edition, by S. M. Sze, (McGraw Hill Publishing Co., 1988).

After the isolation region STI is formed, a conventional gate oxide pre-cleaning process is performed. As is the case in known high performance (e.g., logic) or low performance (e.g., memory or analog) fabrication processes, various conventional gate oxide processes may be used to fabricate devices having different gate oxide thicknesses. The gate oxide insulator 14 can be formed, for example, using a conventional thermal oxidation process. The gate oxide insulator 14 can be formed using $N_2O$, NO, $O_2$ or any combination of them. The gate oxide insulator 14 may be nitridized using a conventional plasma process. Alternatively, the gate oxide insulator 14 can be formed using a base oxide followed by deposition of a high k gate dielectric material such as aluminum oxide, or hafnium oxide, or another high k gate dielectric. The gate dielectric material can have, for example, an approximately (+10%) uniform thickness selected from a range of about (+10%) 0.6 nm to about 7 nm.

Next, the gate electrode 16 is formed conventionally. The gate 16 can, for example, be formed from a polysilicon layer (not shown) deposited by a low pressure chemical vapor deposition (LPCVD) using a reactant gas such as silane ($SiH_4$). The thickness (height) of the layer can be between about 1000 and 3000 Angstroms. The layer can be then conductively doped n-type by ion implanting arsenic ($As^{75}$) or phosphorus ($P^{31}$). The final dopant concentration of the layer after implantations can be between about 1.0 E 18 and 1.0 E 21 atoms/cm$^3$. Conventional photolithographic techniques and conventional anisotropic plasma etching are used to pattern the polysilicon layer which includes forming the gate electrode 16 over the device areas. The device areas include a channel C. The polysilicon layer can be plasma etched using a reactive ion etching (RIE) or a high density plasma (HDP) etching and an etchant gas such as chlorine ($Cl_2$).

After removing a photoresist mask (not shown), for example, by plasma etching in oxygen ($O_2$), lightly doped source and drain (LDD) or extension areas are formed in the device areas adjacent to the gate electrode by ion implantation, using a second conductive type dopant, such as arsenic or phosphorus. Polysilicon sidewall reoxidation layers or offset spacers could be used to offset the LDD implants. Typically, the LDD areas are doped to a concentration of between about 1.0 E 19 and 5.0 E 20 atoms/cm$^3$. Next, a conformal insulating layer (not shown) can be deposited using conventional deposition techniques (e.g., CVD) and anisotropically plasma etched back to form sidewall spacers 20 on the sidewalls of the gate electrode 16 and/or on oxide layers 18. FIG. 1 shows the spacers 20 disposed on the oxide layers 18 formed on the gate 16 and on substrate 10. Typically, the insulating layer for forming the spacers 20 is silicon oxide ($SiO_2$) or a nitride layer and can be deposited by a low pressure CVD (LPCVD) using tetraethosiloxane (TEOS) as the reactant gas, and can be deposited to a preferred thickness of about (+/−10%) 200 Angstroms to about (+/−10%) 1000 Angstroms. Other options include nitride spacers or a combination of multiple spacers with nitride and oxide materials.

A conventional etch back can be then carried out using a reactive ion etching (RIE) and an etchant gas such as carbon tetrafluoride ($CF_4$) and hydrogen $H_2$ or methylfluoride ($CHF_3$), which etches the $SiO_2$ layer selectively to the silicon substrate 10 and polysilicon gate electrode 16. Heavily doped source and drain contact areas S, D are then formed in the device areas adjacent to the insulating sidewall spacers 20 by ion implanting a second conductive type dopant, such as arsenic. The contact areas are doped to a final concentration of between about 1.0 E 18 and 1.0 E 21 atoms/cm$^3$. Any residual native oxide remaining on the source and drain contact areas and the exposed top surface of the polysilicon gate electrode 16 is removed, for example, using a dip etch in a dilute hydrofluoric acid solution.

The foregoing description for FIG. 1 is with respect to nFET devices. Of course, it is understood by those skilled in the art in view of the instant disclosure that the polarity type of dopants is reversed when pFET devices are used, and that conventional masking, patterning etc. are required during processing.

Figure 2:
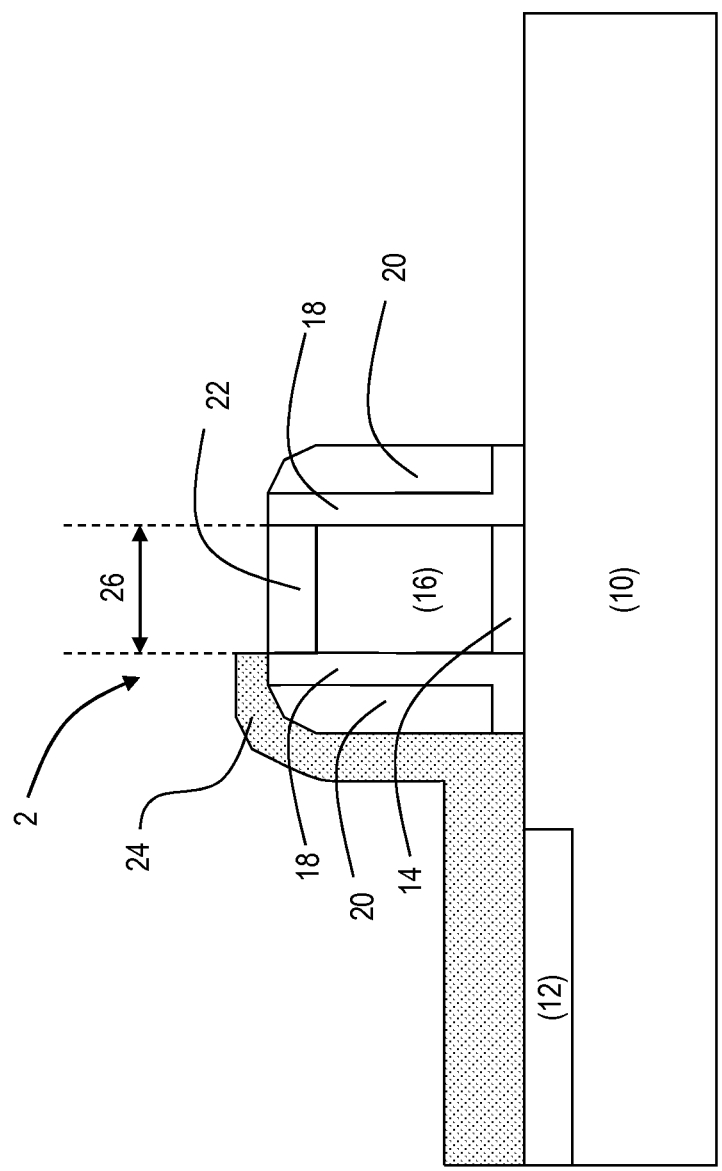
FIG. 2 illustrates the embodiment of FIG. 1 including a mask.

With reference to FIG. 2, a mask 24 is applied to the nFET device 2 and a portion of the mask is removed in an etching process to expose the nitride cap 22 over the gate conductor 16, and the insulator spacers 18 and 20. Mask 24 is removed from the top of the gate conductor 16 to have an edge tolerance 26 being the width of the gate conductor 16.

Figure 3:
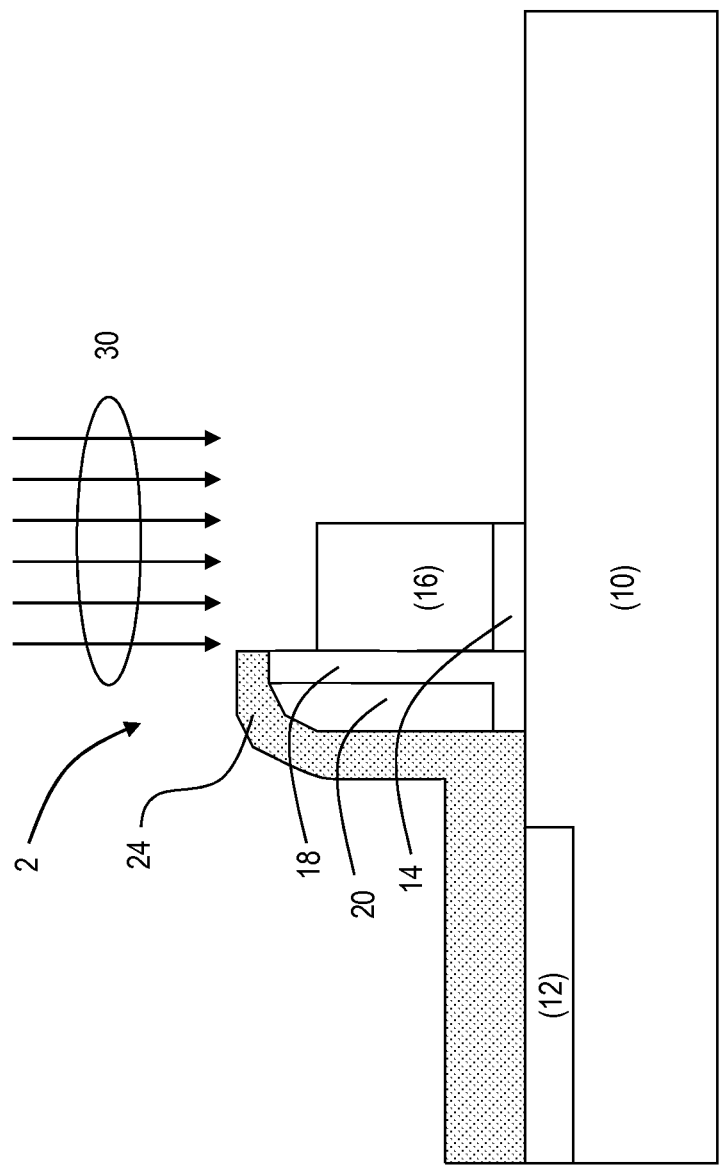
FIG. 3 illustrates the embodiment of FIG. 2 undergoing an etching process.

With reference to FIG. 3, a reactive ion etching 30 removes the nitride cap 22 exposed by the mask 24, and the insulator spacers 18 and 20 only on one side of the nFET device 2. Subsequently, the mask 24 is removed from the nFET device 2.

Figure 4:
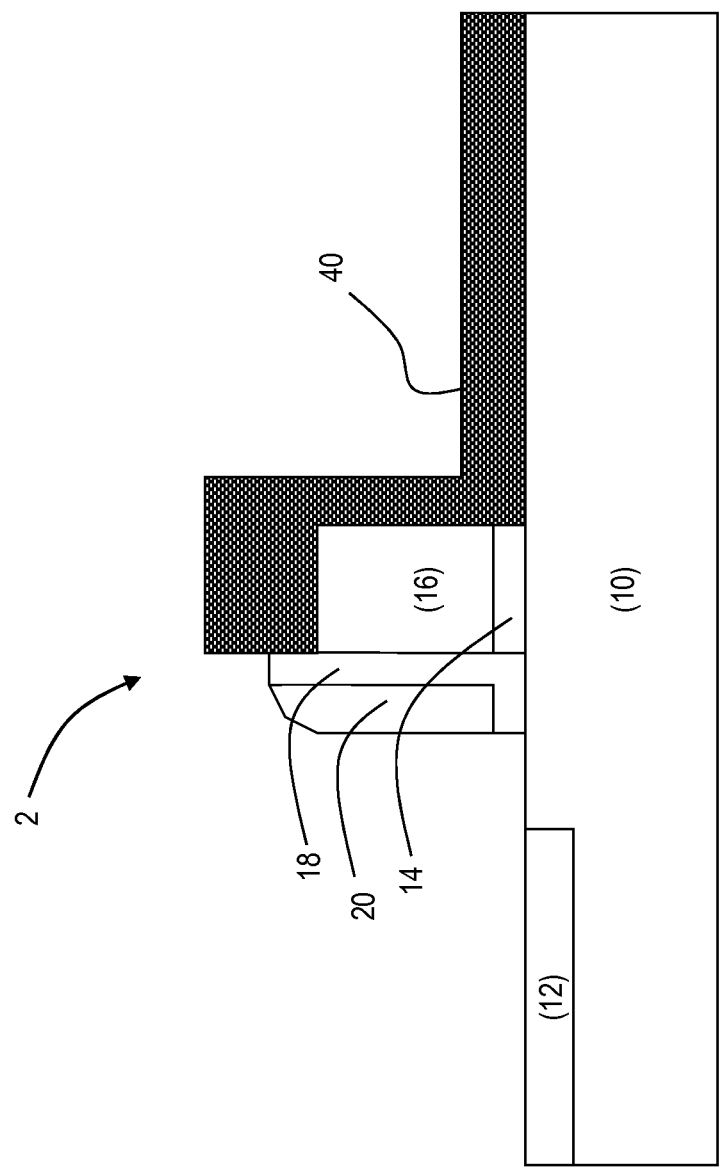
FIG. 4 illustrates the embodiment of FIG. 3 receiving a silicide.

With reference to FIG. 4, a silicide layer 40 is contiguously deposited on the top of the gate conductor 16, along a sidewall of the gate conductor 16, along the entire sidewall or edge of the insulator 14 to the substrate 10, and across a region of the substrate adjacent to the nFET device 2.

Figure 5:
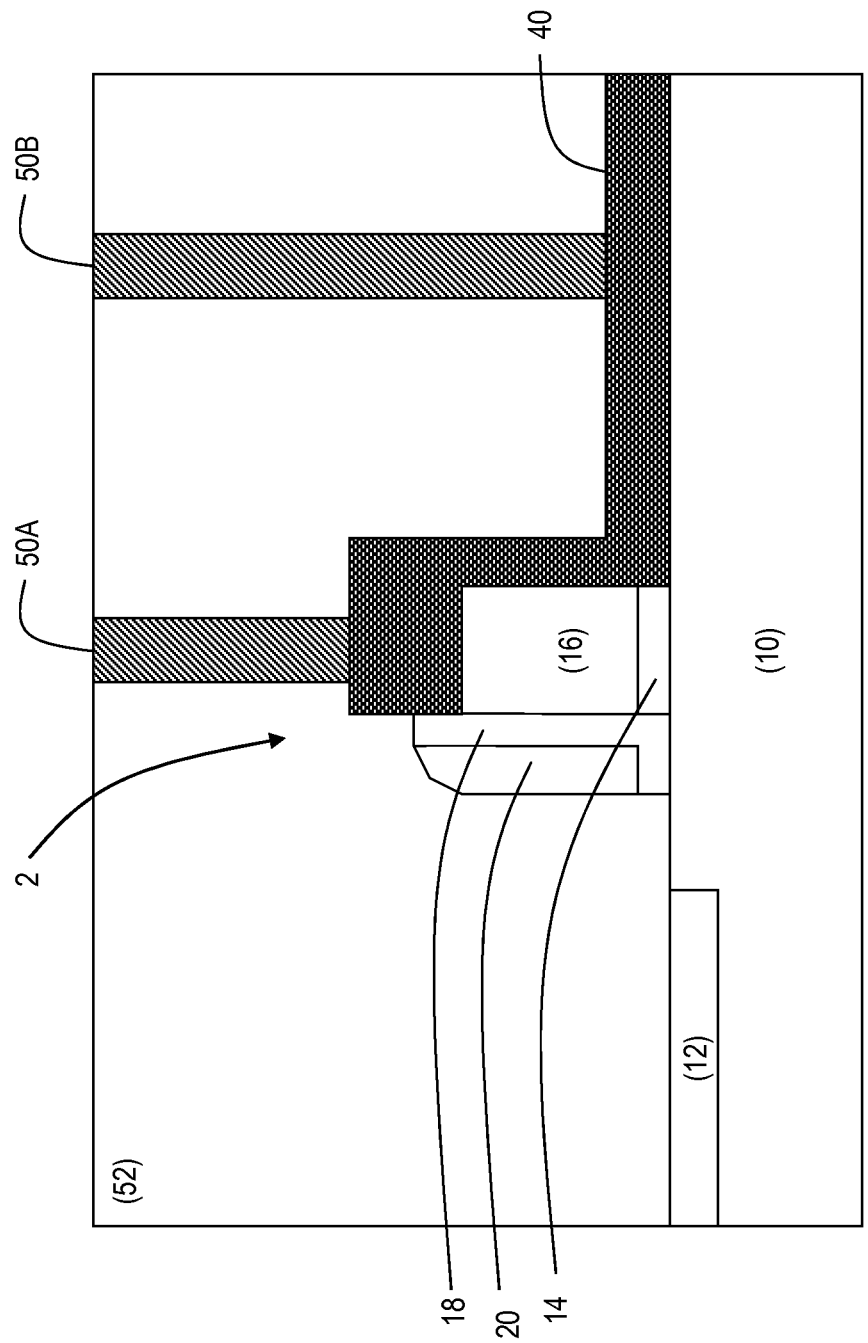
FIG. 5 illustrates the embodiment of FIG. 4 receiving electrical conductors and dielectrics.

With reference to FIG. 5, CA (Cathode/Anode) contacts 50A and 50B are fabricated by conventional means directly over the portion of the silicide layer 40 that covers the top of the gate conductor 16, and over a portion of the silicide layer 40 that is adjacent to the nFET device 2. Thereafter, a dielectric or dielectrics 52 cover the nFET device 2, the silicide layer 40 and the vertical portions of the CA contacts 50A/50B.

In summary, one embodiment of a discrete e-fuse includes a substrate 10, a patterned gate insulator 14 on the substrate 10, and a patterned gate conductor 16 on the patterned gate insulator 14. The patterned gate conductor 16 includes sidewalls and a top. A silicide 40 contacts the sidewalls of the patterned gate conductor 16, the top of the patterned gate conductor 16, and a region of the substrate 10 adjacent the patterned gate insulator 14 and the patterned gate conductor 16, where this region of the substrate contacts the patterned gate insulator.

The patterned gate insulator 14 has a width equal to a width of the patterned gate conductor 16, and the patterned gate conductor 16 has a length greater than the width of the patterned gate conductor 16, where the length is defined by the sidewalls.

A first electrical contact 50A is connected to the silicide 40 over the top of the patterned gate conductor 16, and a second electrical contact 50B is connected to the silicide 40 over the region of the substrate adjacent the patterned gate insulator 14.

Figure 6:
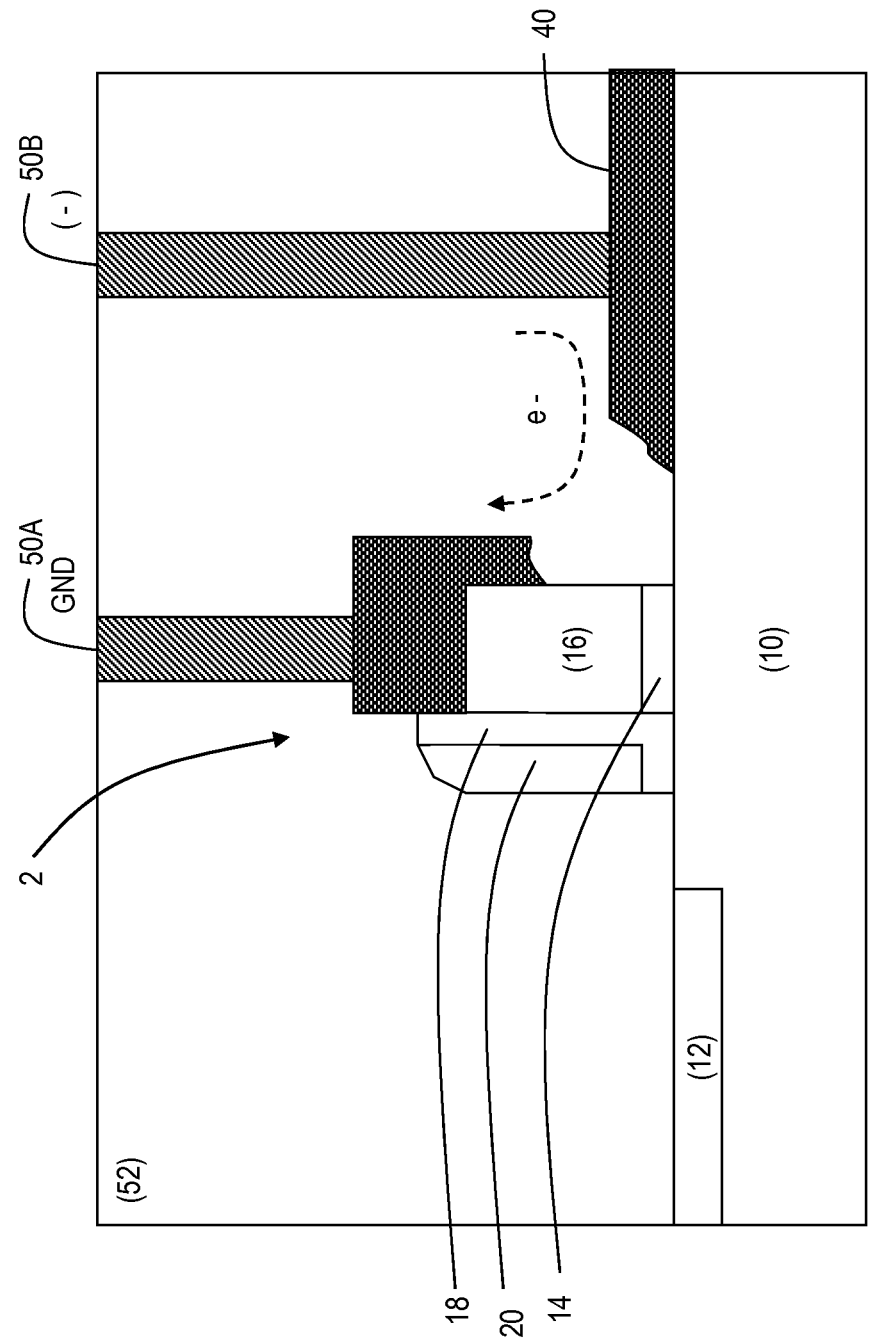
FIG. 6 illustrates the embodiment of FIG. 5 where one electrical conductor receives a current and the other electrical conductor is at ground.

With reference to FIG. 6, when contact 50A is set to ground (GND) and a current source is applied to contact 50B (−), the silicide 40 is broken in a region between the gate conductor 16 and the substrate adjacent the nFET device 2, and the e-fuse is programmed. Thus, the silicide 40 is continuous between the region of the substrate 10 and the patterned gate conductor 16 in an unprogrammed state, and the silicide 40 is discontinuous between the region of the substrate 10 and the patterned gate conductor 16 in a programmed state, which changes the resistance level of the e-fuse. The vertical portion of the silicide 40 applied to the sidewall of the gate conductor 16 and the gate insulator 14 is the weakest point in the e-fuse structure for programming. The silicide damage, or discontinuity, is due to poorer coverage of silicide 40 at the corner/sidewall of the gate conductor 16 and corresponding gate insulator 14, current crowding at the corner of the substrate 10 and the gate insulator 14, and localized heating expected at the sidewall of the gate conductor 16 and gate insulator 14 due to lower heat passivation.

Figure 7:
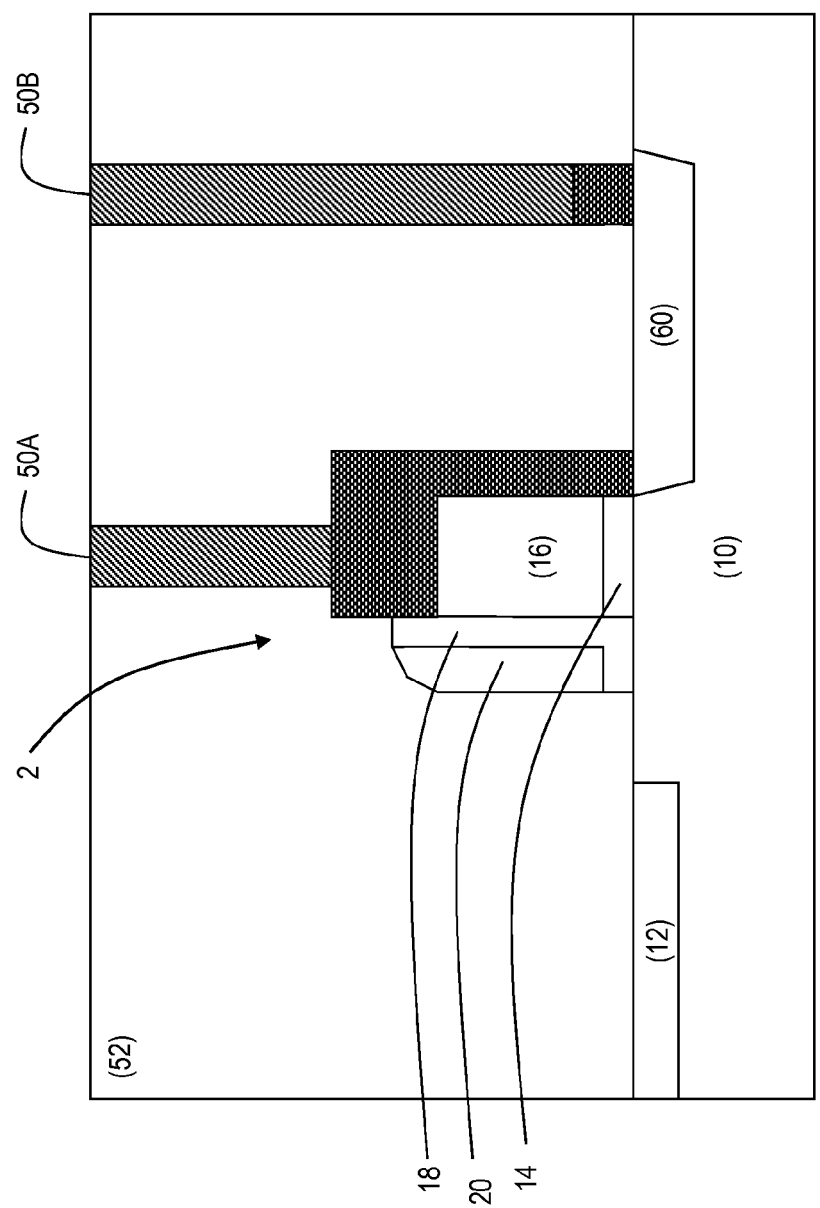
FIG. 7 illustrates an alternate embodiment starting from FIG. 3 where a diffusion layer provides electrical continuity between paired electrical conductors.

FIG. 7 illustrates an alternate embodiment from FIG. 3 where a diffusion area 60 is created in the region of the substrate 10 adjacent the gate conductor 16 and the contact 50B and provides electrical continuity between the paired electrical conductors 50A and 50B in a similar manner as the silicide layer 40 does in FIG. 5.

Figure 8:
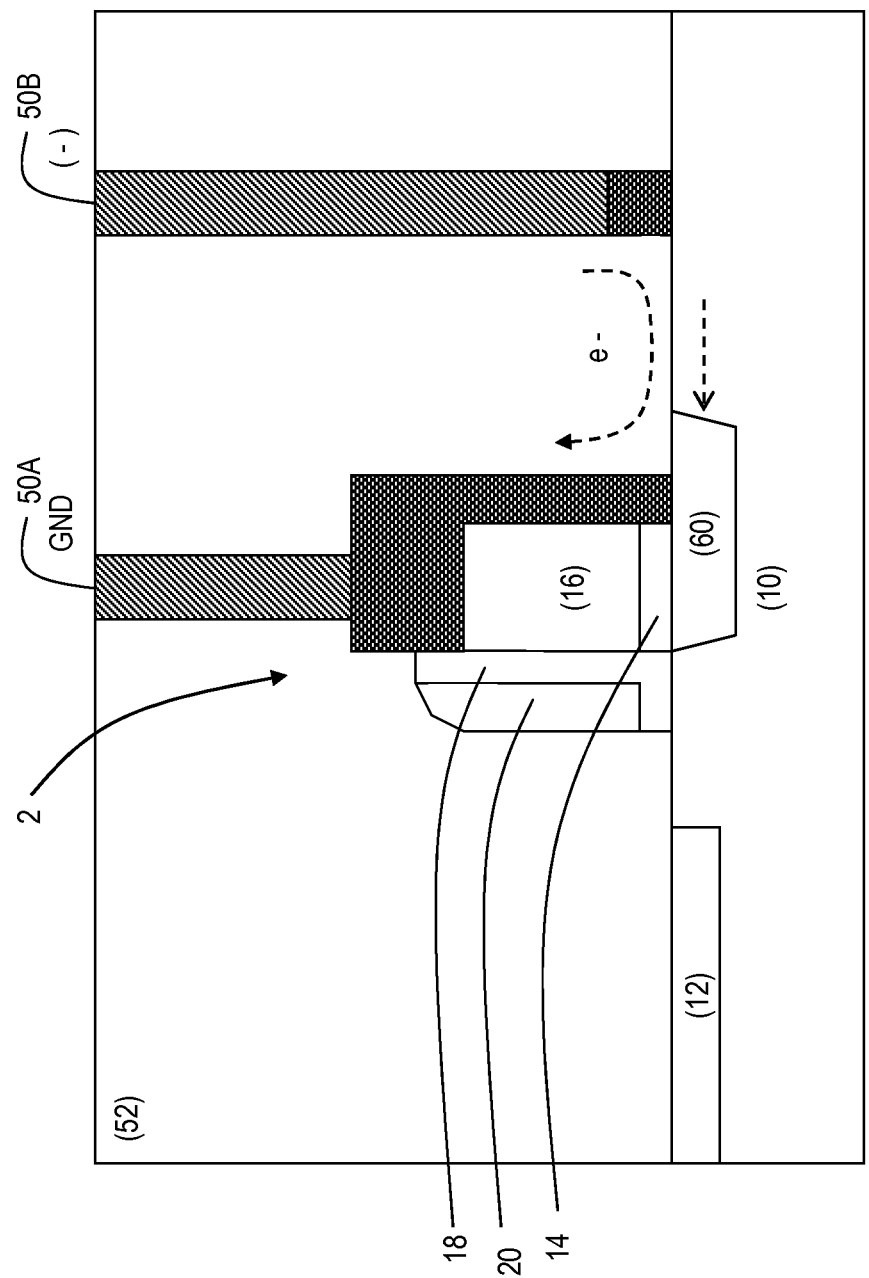
FIG. 8 illustrates the alternate embodiment of FIG. 7 where one electrical conductor receives a current and the other paired electrical conductor is at ground.

FIG. 8 illustrates the alternate embodiment of FIG. 7 when contact 50A is set to ground (GND) and a current source (−) is applied to contact 50B. The diffusion layer 60 is disrupted and moved toward the region between the gate conductor 16 and the substrate adjacent the nFET device 2, away from the electrical contact 50B, and the e-fuse is programmed. Thus, the diffusion layer 60 is continuous between the patterned gate conductor 16 and the contact 50B in an unprogrammed state, and the diffusion layer 60 is discontinuous between the region of the patterned gate conductor 16 and the contact 50B in a programmed state, which changes the resistance level of the e-fuse. The diffusion area 60 acts similar to the silicide layer 40 in FIGS. 5-6 in programming the e-fuse.

Figure 9:
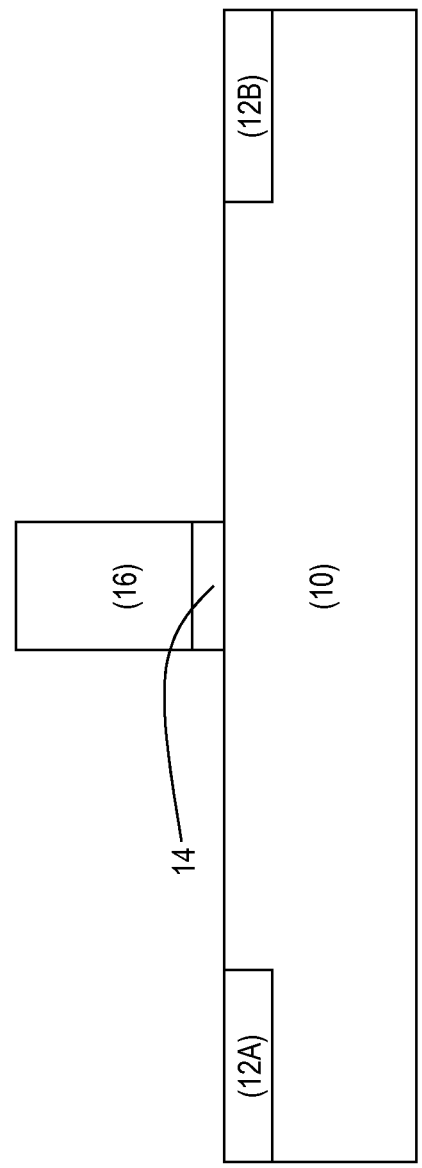
FIG. 9 illustrates another embodiment including a preliminary structure on a silicon substrate.

Another embodiment of manufacturing a paired e-fuse is shown in FIG. 9, where a silicon substrate 10 is provided with embedded STI regions 12A and 12B on either side of an insulator 14 on an upper surface of the silicon substrate 10. A conductive polysilicon gate 16 is provided on the insulator 14 in a similar fashion to that of FIGS. 1-8.

Figure 10:
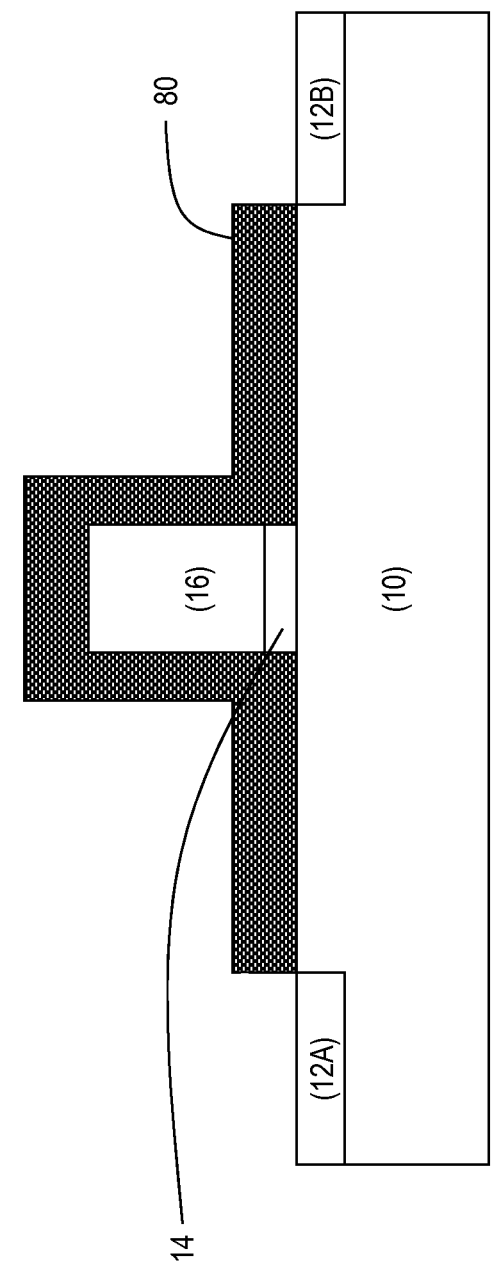
FIG. 10 illustrates the embodiment of FIG. 7 receiving a silicide.

With reference to FIG. 10, a silicide layer 80 is deposited over the gate conductor 16 and the insulator 14 and onto the substrate 10 on both sides of the conductor/insulator structure.

Figure 11:
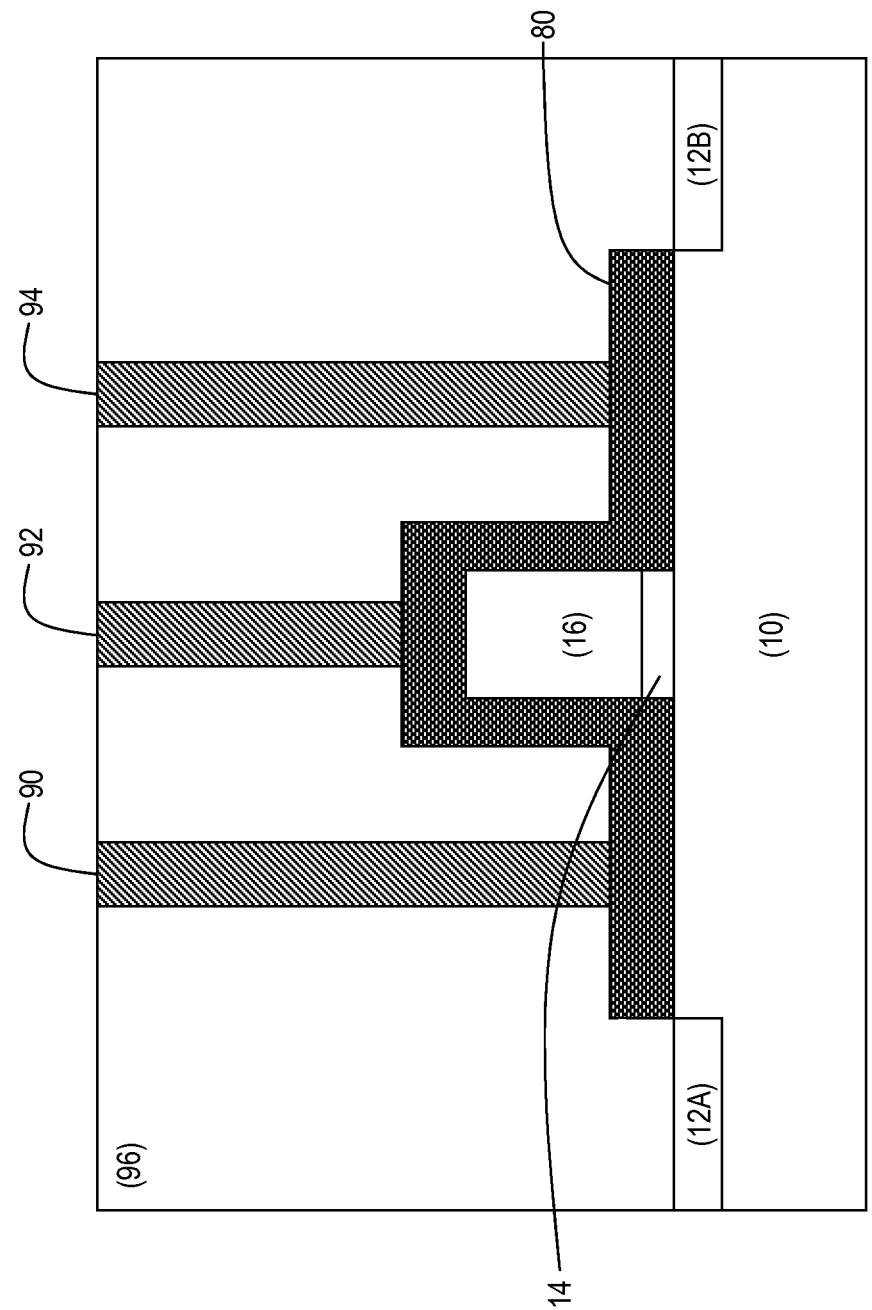
FIG. 11 illustrates the embodiment of FIG. 8 receiving electrical conductors and dielectrics.

With reference to FIG. 11, CA (Cathode/Anode) contacts 90 and 94 are positioned over the silicide 80 between the STI regions 12A and 12B and the gate conductor 16, and contact 92 is positioned over the silicide 80 directly over the gate conductor 16 and insulator 14. Thereafter, dielectric(s) 96 cover the e-fuse devices and the vertical portions of the contacts 90, 92 and 94.

Figure 12:
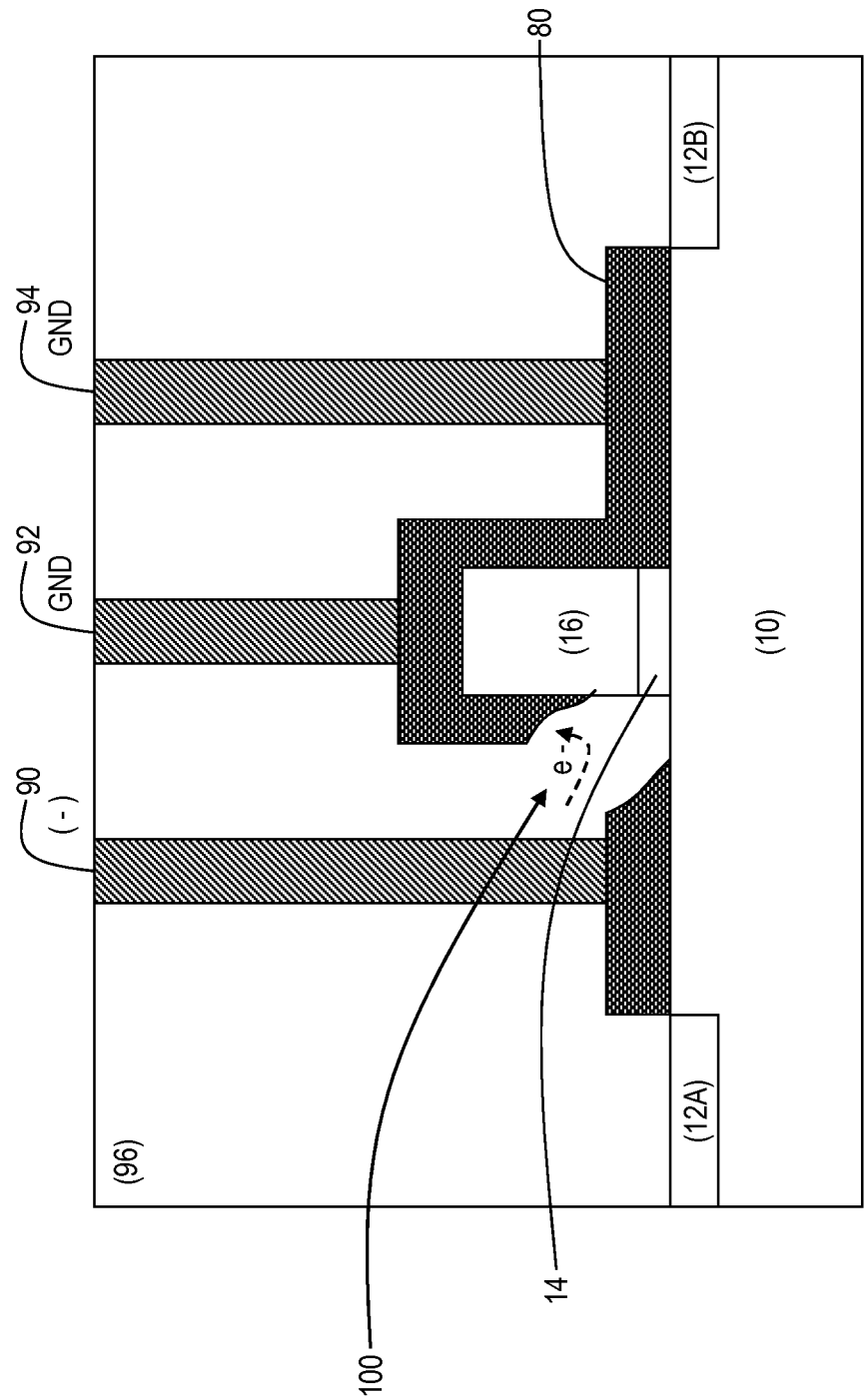
FIG. 12 illustrates a first alternative embodiment of FIG. 9 where one electrical conductor receives a current and the other electrical conductor is at ground.

With reference to FIG. 12, an e-fuse may be programmed by applying contacts 92 and 94 to ground (GND) and applying a current (−) to contact 90 which creates a discontinuity 100 in the silicide 80 between the region in the substrate 10 adjacent the gate conductor 16 and the gate conductor 16 and insulator 14.

Figure 13:
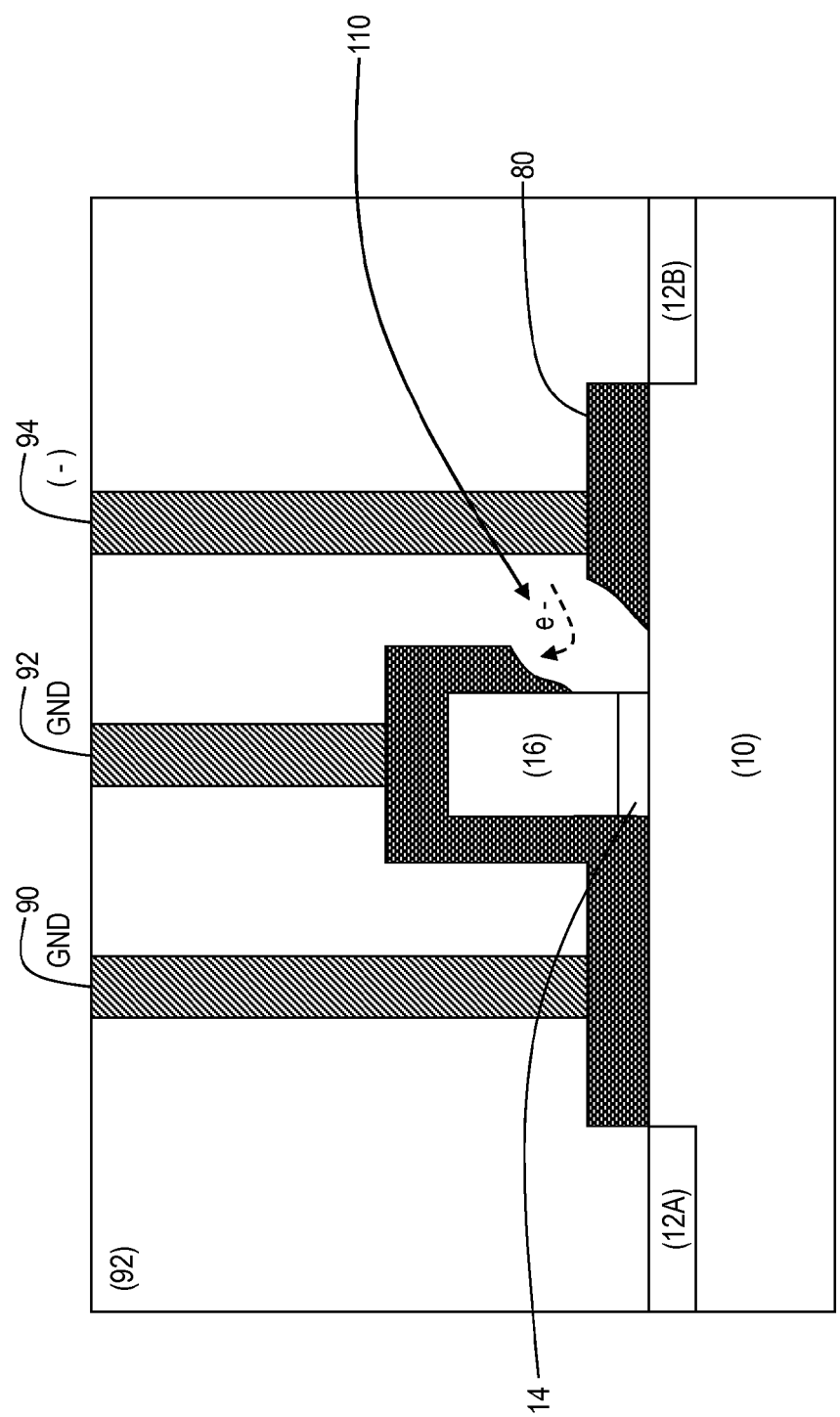
FIG. 13 illustrates the alternative embodiment as depicted in FIG. 12 where the other electrical conductor receives a current and another electrical conductor is at ground.

In an alternative configuration of FIG. 9, FIG. 13 illustrates an e-fuse may be programmed by applying contacts 90 and 92 to ground (GND) and applying a current (−) to contact 94 which creates a discontinuity 110 in the silicide 80 between the region in the substrate 10 adjacent the gate conductor 16 and the gate conductor 16 and insulator 14.

Figure 14:
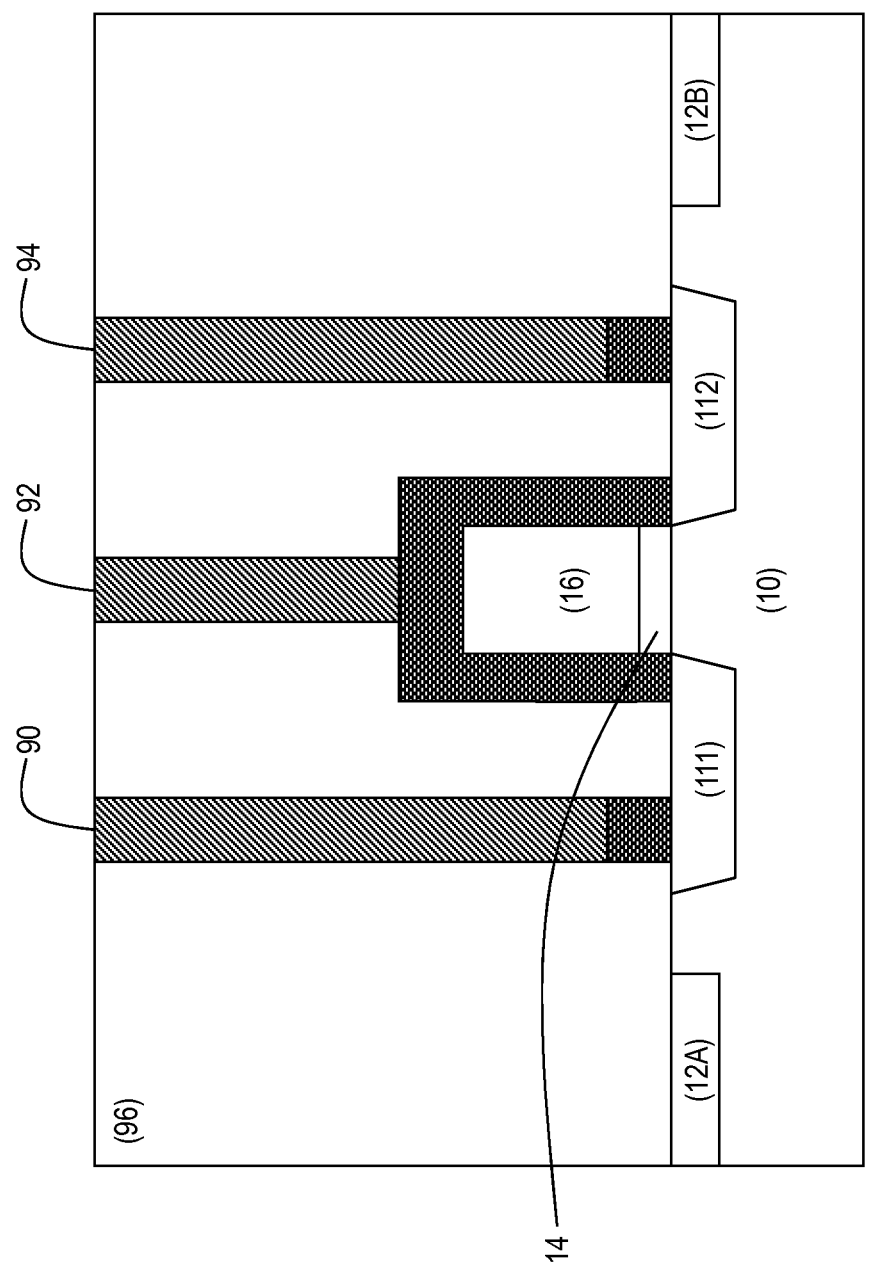
FIG. 14 illustrates a second alternative embodiment of FIG. 9 where diffusion layers provide electrical continuity between the paired electrical conductors.

FIG. 14 illustrates a second alternative embodiment of FIG. 9 where diffusion layers 111 and 112 provide electrical continuity between the paired electrical conductors 90/92 and 92/94, respectively. Diffusion areas 111/112 are created in the region of the substrate 10 adjacent the gate conductor 16 and the contacts 90 and 94.

Figure 15:
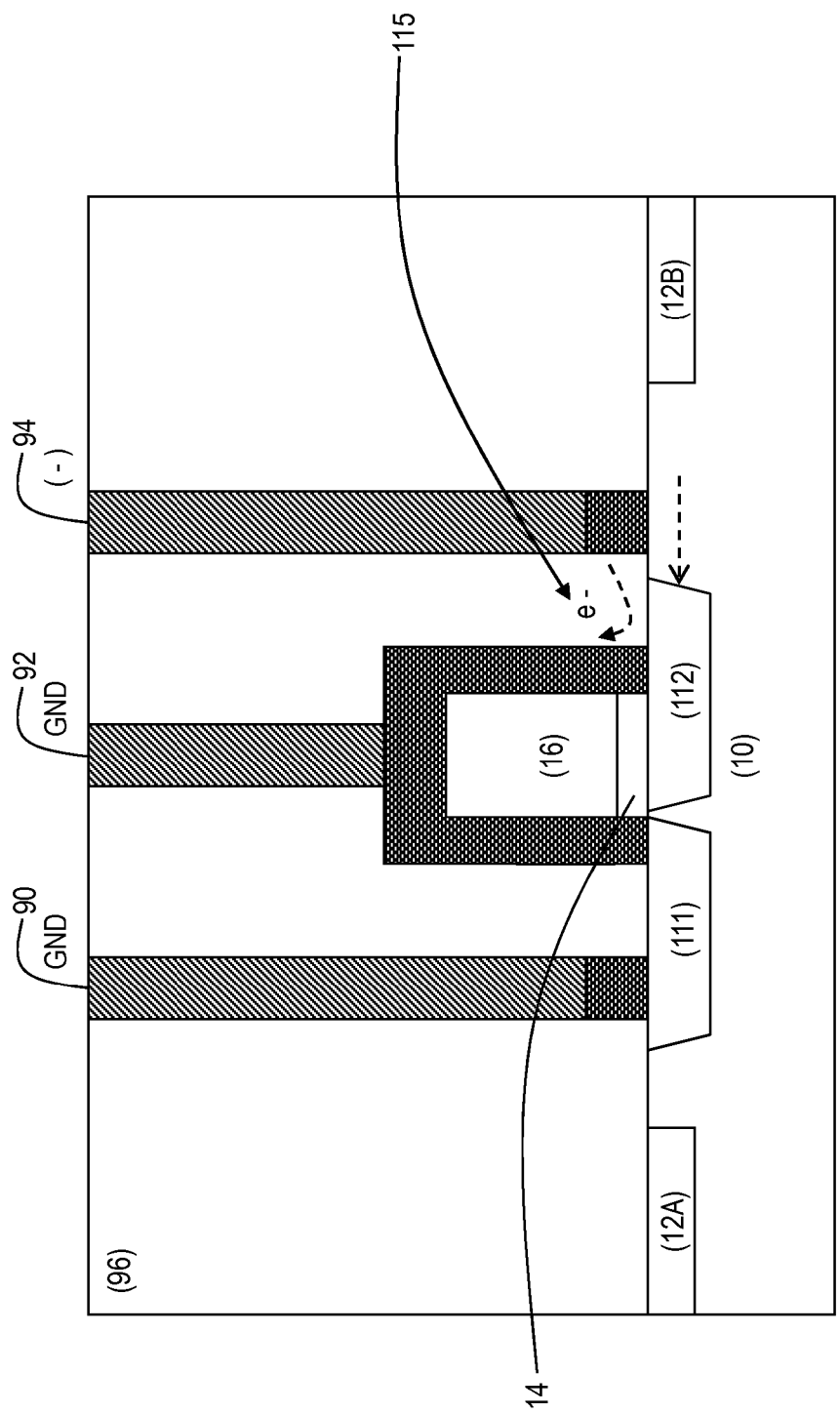
FIG. 15 illustrates the second alternative embodiment of FIG. 14 where one electrical conductor receives a current and the other paired electrical conductor is at ground.

FIG. 15 illustrates the second alternative embodiment of FIG. 14 where one electrical conductor, in this case, contact 94, receives a current and the other paired electrical conductor contact 92 is at ground. The diffusion area 112 is disrupted and moved toward the region between the gate conductor 16 and the substrate adjacent the nFET device 2, away from the electrical contact 94, and the e-fuse is programmed. Thus, the diffusion area 112 is continuous between the patterned gate conductor 16 and the contact 94 in an unprogrammed state, and the diffusion area 112 is discontinuous between the region of the patterned gate conductor 16 and the contact 94 in a programmed state which changes the resistance level of the e-fuse. Alternatively, contact 90 may receive current and bias the diffusion layer 111 toward the patterned gate conductor, thereby programming the e-fuse in a similar manner as shown in FIG. 12. The diffusion areas 111/112 act similar to the silicide layer 80 in FIGS. 10-13 in programming the e-fuse.

Figure 16:
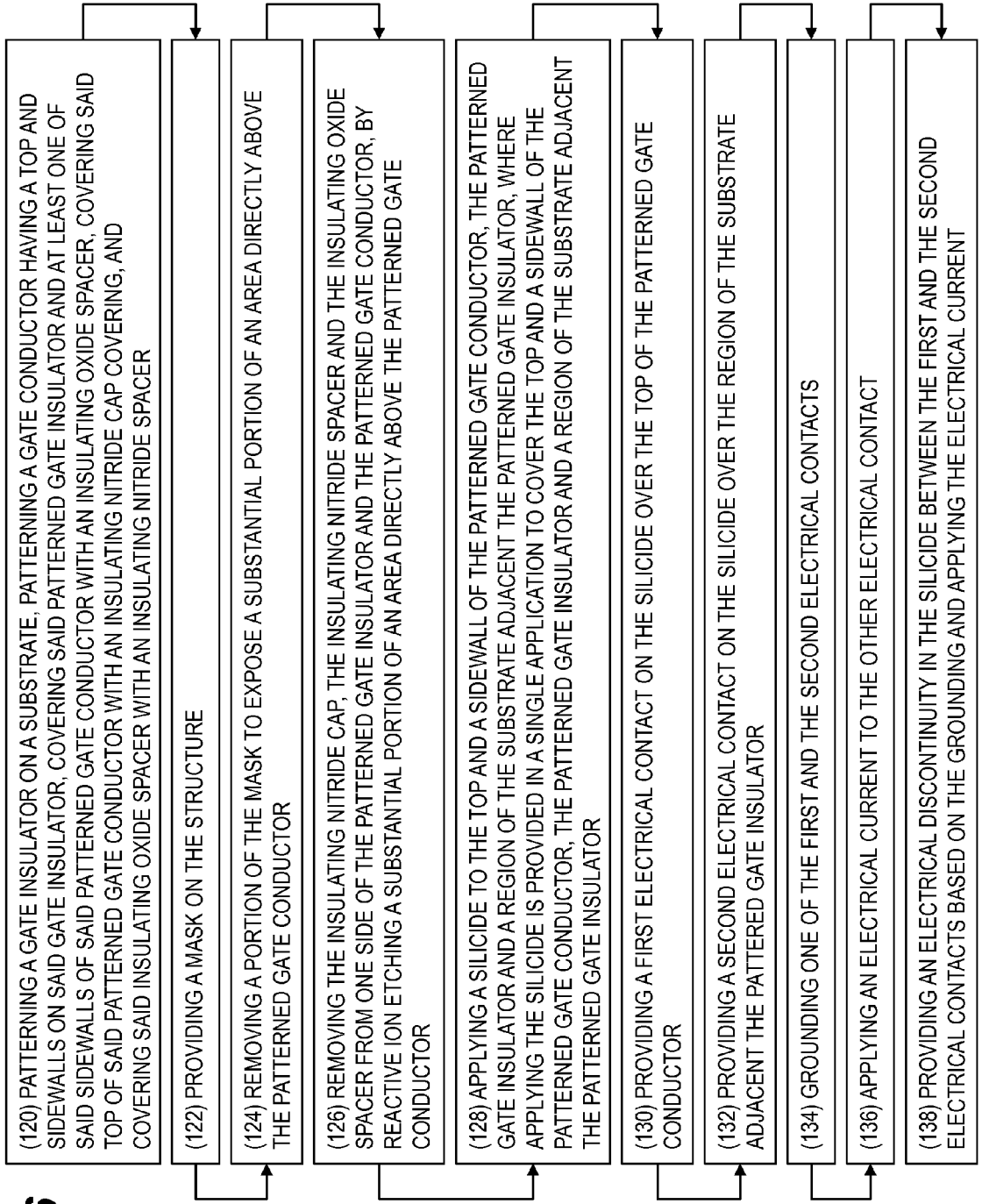
FIG. 16 illustrates a logical flowchart of a method of an embodiment.

With reference to FIG. 16, a method of manufacturing an e-fuse includes providing a structure that includes a substrate, a patterned gate insulator, and a patterned gate conductor having a top and sidewalls. An insulating oxide spacer covers the patterned gate insulator and at least one of the sidewalls of the patterned gate conductor. An insulating nitride cap covers the top of the patterned gate conductor, and an insulating nitride spacer covers the insulating oxide spacer 120.

The insulating nitride cap, the insulating nitride spacer and the insulating oxide spacer from one side of the patterned gate insulator and the patterned gate conductor is removed. The removal processed further includes providing a mask 122 on the structure, and removing 124 a portion of the mask to expose a substantial portion of an area directly above the patterned gate conductor. Thereafter, reactive ion etching removes a substantial portion of the area directly above the patterned gate conductor 126.

Silicide is applied 128 to the top and a sidewall of the patterned gate conductor, the patterned gate insulator and a region of the substrate adjacent the patterned gate insulator. The silicide can be provided in a single application to cover the top and a sidewall of the patterned gate conductor, the patterned gate insulator and a region of the substrate adjacent the patterned gate insulator.

A first electrical contact 130 is provided on the silicide over the top of the patterned gate conductor, and a second electrical contact is provided 132 on the silicide over the region of the substrate adjacent the pattered gate insulator.

Grounding one of the first and the second electrical contacts 134, and applying an electrical current 136 to the other of the first and the second electrical contacts, provides an electrical discontinuity 138 in the silicide between the first and the second electrical contacts based on the grounding and applying the electrical current.

Figure 17A:
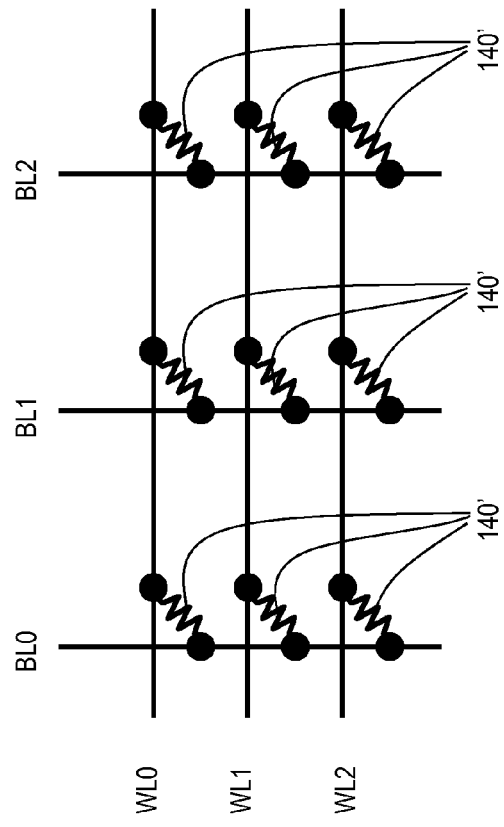
FIG. 17A illustrates a first schematic circuit representation of a discrete e-fuse.
Figure 17B:
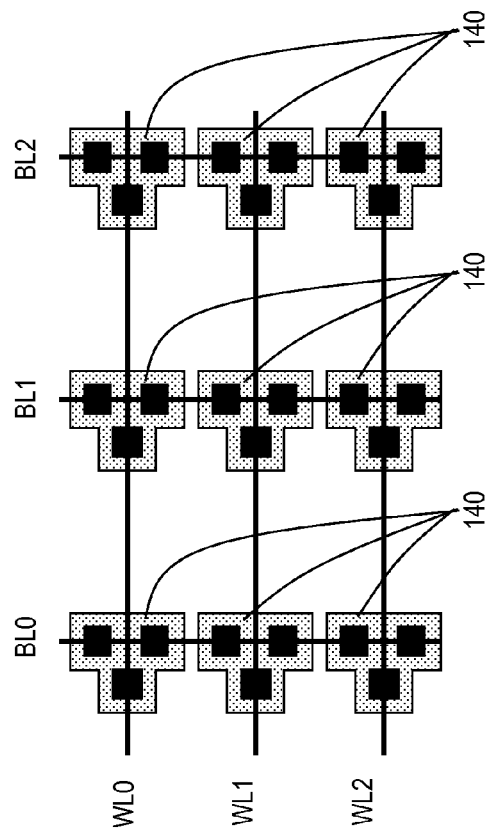
FIG. 17B illustrates the embodiment of FIG. 17A in a plan view.

With reference to FIG. 17A, bit lines BL0, BL1 and BL2 each intersect with word lines WL0, WL1 and WL2 where a schematic representation of a discrete e-fuse 140' is depicted. With reference to FIG. 17B, discrete e-fuses 140 are shown having a single CA (Cathode/Anode) connection on each word line at the word line/bit line intersection, and having two CAs per word line/bit line intersection on the bit lines. Each e-fuse link can be addressed through the word lines and bit lines for programming and sensing.

Figure 18A:
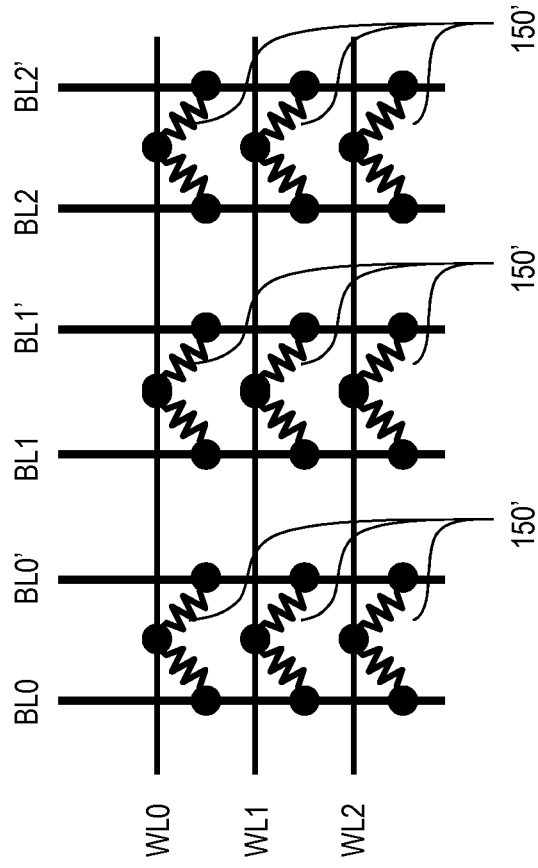
FIG. 18A illustrates a second schematic circuit representation of a paired e-fuse.
Figure 18B:
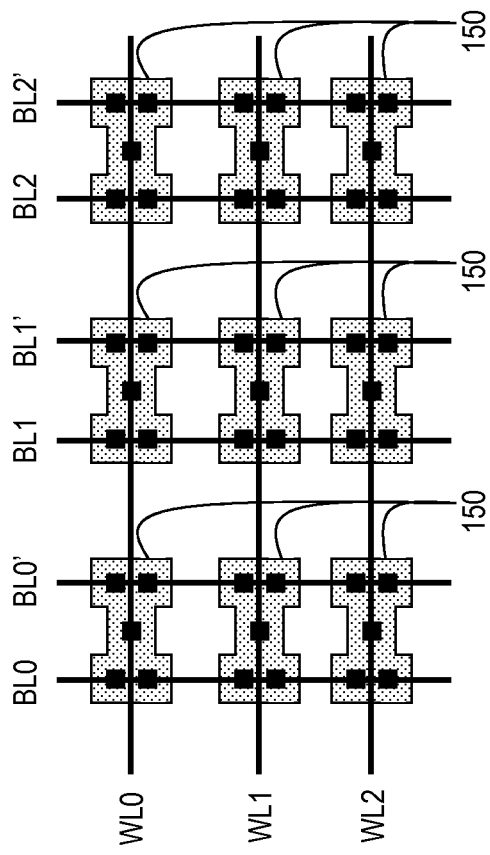
FIG. 18B illustrates the embodiment of FIG. 18A in a plan view.

With reference to FIG. 18A, bit line pairs BL0/BL0', BL1/BL1' and BL2/BL2' each intersect with word lines WL0, WL1 and WL2 where a schematic representation of a paired e-fuse 150' is depicted. With reference to FIG. 18B, paired e-fuses 150 are shown having a single CA (Cathode/Anode) connection on each word line at the word line/bit line intersection, and having two CAs per word line/bit line intersection on each bit line of the bit line pairs, BL0/BL0', BL1/BL1' and BL2/BL2'. Again, each e-fuse link can be addressed through the word lines and each bit line of the bit line pairs for programming and sensing.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

What is claimed is:

1. A method of manufacturing an e-fuse comprising:
   patterning an insulator on a substrate;
   patterning a conductor on said insulator, said conductor having a top and sidewalls;
   covering said insulator and at least one of said sidewalls of said conductor with a first insulating spacer;
   covering said top of said conductor with an insulating cap;
   covering said first insulating spacer with a second insulating spacer;
   removing said insulating cap;
   removing said second insulating spacer and said first insulating spacer from one side of said insulator and said conductor;
   forming a silicide on said top and one sidewall of said conductor, said insulator, and a region of said substrate adjacent said insulator, said one sidewall being free of insulating spacers, and said region of said substrate being adjacent said one sidewall;
   providing a first electrical contact on said silicide over said top of said conductor; and
   providing a second electrical contact on said silicide over said region of said substrate adjacent said insulator.

2. The method according to claim 1, said removing said insulating cap further comprising:
   providing a mask on said conductor, said substrate, said first insulating spacer an said second insulating spacer; and
   removing a portion of said mask to expose a substantial portion of an area directly above said conductor.

3. The method according to claim 2, said removing further comprising:
   reactive ion etching said substantial portion of said area directly above said conductor.

4. The method according to claim 1, said forming said silicide being provided in a single application to cover said top and one sidewall of said conductor, said insulator, and said region of said substrate adjacent said insulator.

5. The method according to claim 1, further comprising programming said e-fuse by:
   grounding one of said first electrical contact and said second electrical contact; and
   applying an electrical current to the other of said first electrical contact and said second electrical contact,
   providing an electrical discontinuity in said silicide between said first electrical contact and said second electrical contact based on said grounding and applying said electrical current.

6. The method according to claim 1, said insulator comprising a gate insulator.

7. The method according to claim 1, said conductor comprising a gate conductor.

8. The method according to claim 1, said insulating spacer comprising an insulating oxide spacer.

9. The method according to claim 1, said insulating cap comprising an insulating nitride cap.

10. The method according to claim 1, said second insulating spacer comprising an insulating nitride spacer.

11. The method according to claim 1, further comprising:
removing said silicide between said second electrical contact and said one sidewall; and
creating a diffusion area in a region of said substrate adjacent said conductor and said second electrical contact, said diffusion area providing electrical continuity between said first electrical contact and said second electrical contact.

12. The method according to claim 11, further comprising programming said e-fuse by:
grounding one of said first electrical contact and said second electrical contact; and
applying an electrical current to the other of said first electrical contact and said second electrical contact,
said diffusion area moving away from said first electrical contact or said second electrical contact having said electrical current applied, providing an electrical discontinuity in said substrate between said first electrical contact and said second electrical contact based on said grounding and applying said electrical current.

* * * * *